United States Patent [19]
Hirao et al.

[11] Patent Number: 5,661,068
[45] Date of Patent: Aug. 26, 1997

[54] METHOD OF FABRICATING A SEMICONDUCTOR DEVICE

[75] Inventors: Shuji Hirao, Osaka; Hisashi Ogawa, Katano; Yuka Terai, Osaka; Mitsuru Sekiguchi, Hirakata; Masanori Fukumoto, Osaka; Isao Miyanaga, Moriguchi, all of Japan

[73] Assignee: Matsushita Electric Industrial Co., Ltd., Osaka, Japan

[21] Appl. No.: 467,290

[22] Filed: Jun. 6, 1995

Related U.S. Application Data

[62] Division of Ser. No. 9,583, Jan. 26, 1993, Pat. No. 5,474,949.

[30] Foreign Application Priority Data

Jan. 27, 1992 [JP] Japan ................. 4-11685
Jul. 23, 1992 [JP] Japan ................. 4-196698

[51] Int. Cl.$^6$ ............................. H01L 21/265
[52] U.S. Cl. ................. 438/398; 438/660; 438/665; 438/964
[58] Field of Search ................. 437/52, 60, 194, 437/245, 919, 977, 195; 148/DIG. 14

[56] References Cited

U.S. PATENT DOCUMENTS

| | | |
|---|---|---|
| 4,718,992 | 1/1988 | Funahashi et al. . |
| 4,727,044 | 2/1988 | Yamazaki ................. 437/45 |
| 4,800,177 | 1/1989 | Nakamae . |
| 4,804,438 | 2/1989 | Rhodes ................. 156/653 |
| 4,873,205 | 10/1989 | Critchlow et al. ................. 437/200 |
| 4,892,843 | 1/1990 | Schmitz et al. . |
| 4,927,783 | 5/1990 | Arai et al. . |
| 5,043,780 | 8/1991 | Fazan et al. . |
| 5,071,788 | 12/1991 | Joshi . |
| 5,082,797 | 1/1992 | Chan . |
| 5,110,752 | 5/1992 | Lu . |
| 5,138,411 | 8/1992 | Sandhu . |
| 5,147,826 | 9/1992 | Liu et al. ................. 437/233 |
| 5,195,018 | 3/1993 | Kwon et al. . |
| 5,223,081 | 6/1993 | Doan ................. 156/628 |
| 5,223,455 | 6/1993 | Itoh et al. . |
| 5,231,042 | 7/1993 | Ilderem et al. . |
| 5,231,054 | 7/1993 | Kosugi . |
| 5,232,876 | 8/1993 | Kim et al. . |
| 5,236,865 | 8/1993 | Sandhu et al. . |
| 5,240,879 | 8/1993 | De Bruin . |
| 5,332,696 | 7/1994 | Kim et al. ................. 437/233 |

FOREIGN PATENT DOCUMENTS

| | | |
|---|---|---|
| 2-166760 | 6/1990 | Japan . |
| 4-196162 | 7/1992 | Japan . |

OTHER PUBLICATIONS

H. Watanabe et al., "A New Stacked Capacitor Structure Using Hemispherical–Grain (HSG) Poly–Silicon Electrodes", *Extended Abstracts of the 22nd (1990) International) Conference on Solid State Devices and Materials*, at pp. 873–876, S–CII–5 (Sendai, 1990), month unknown.

M.L. Green et al., "The Formation and Structure of CVD W Films Produced by the Si Reduction of $WF_6$", *The Electrochem. Society Solid–State Science and Technology*, vol. 134, No. 9, at pp. 2285–2292, (Sep., 1987).

Wolf and Tauber, "Silicon Processing for the VLSI Era", vol. I, p. 367, 1986, no month provided.

Wolf, "Silicon Processing for the VLSI Era vol. 2: Process Integration", pp. 111–117 1990 month unknown.

*Primary Examiner*—John Niebling
*Assistant Examiner*—Richard A. Booth
*Attorney, Agent, or Firm*—Ratner & Prestia

[57] ABSTRACT

A method of the invention for fabricating a semiconductor device includes the steps of: forming an oxide film having a non-uniform thickness on silicon; reducing at least a portion of the oxide film using gas containing a metal element, and growing a metal film containing the metal element on the silicon by reacting an exposed surface of the silicon with the gas; and removing the metal film.

5 Claims, 8 Drawing Sheets

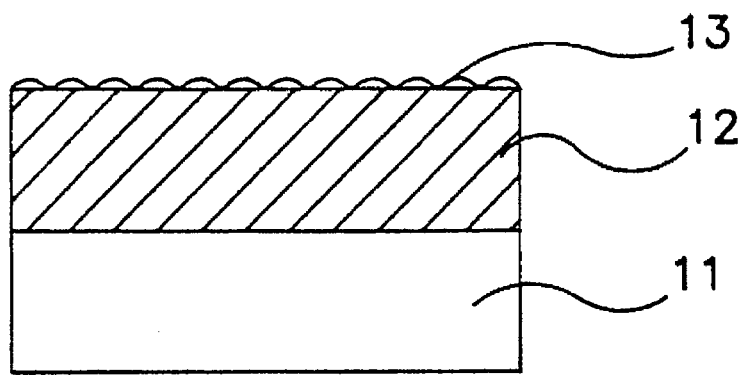
FIG. IA
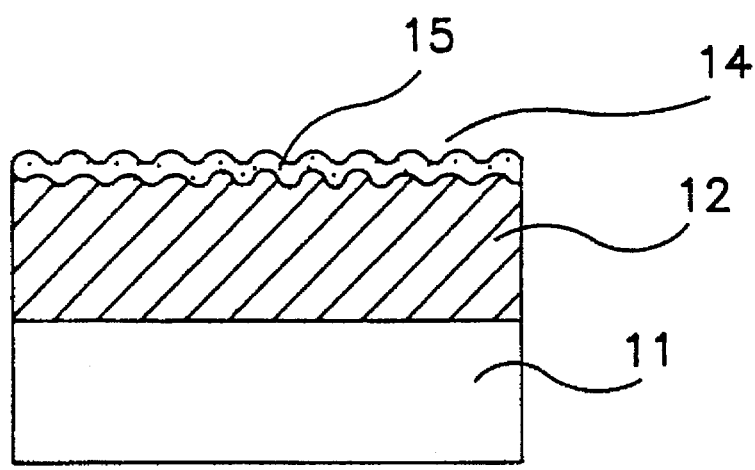
FIG. IB
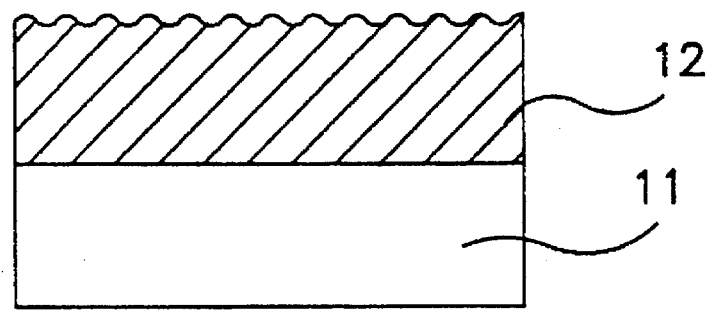
FIG. IC

METHOD OF FABRICATING A SEMICONDUCTOR DEVICE

This application is a division of application Ser. No. 08/009,583, filed Jan. 26, 1993, now U.S. Pat. No. 5,474,949.

BACKGROUND OF THE INVENTION

1. Field of the Invention

The present invention relates to a method of fabricating a semiconductor device, and more particularly to a method by which a surface area of a silicon material used in a semiconductor device is increased.

2. Description of the Related Art

A silicon film is widely used as a charge storage electrode for a capacitor used in a semiconductor device, such as a capacitor of a stacked-type memory cell used in a dynamic random access memory (DRAM). In order to realize a highly-integrated semiconductor device by reducing the size of each memory cell, it is necessary to reduce the size of each capacitor without decreasing the capacitance of the capacitor. Accordingly, some techniques for increasing an area of a charge storage electrode for a capacitor, i.e., a surface area of a silicon film are suggested.

In some conventional semiconductor devices, when a silicon film is deposited by chemical vapor deposition (CVD), a surface of the silicon film is made uneven by adjusting the deposition temperature, whereby an area of an electrode for a capacitor is increased. One example of such conventional semiconductor devices is disclosed in H. Watanabe et al., Sym. on VLSI Tech. page 873 (1990). FIG. 7 is a graph showing the relationship between a deposition temperature of a non-doped silicon film and a capacitance of a capacitor which has the deposited non-doped silicon film as a charge storage electrode. As can be seen from FIG. 7 that the surface area of the non-doped silicon film is remarkably increased when the deposition temperature is within plus or minus 0.4° C. centered at 550° C.

However, according to the above prior art technique, the deposition temperature suitable for increasing the surface area of the silicon film falls within a narrow range, i.e., within plus or minus 0.4° C. centered at 550° C. Accordingly, at a temperature out of the range, the surface of the silicon film is not made largely uneven. It is difficult to adjust the deposition temperature within such a narrow range. The degree of unevenness formed at the surface of the silicon film varies depending on the concentration of impurities contained in the deposited silicon film. For the above reasons, the prior art technique has a problem in that a capacitance of a capacitor cannot be increased with good reproducibility.

SUMMARY OF THE INVENTION

The method of fabricating a semiconductor device of this invention includes the steps of: forming an oxide film having a non-uniform thickness on silicon; reducing at least a portion of the oxide film using gas containing a metal element, and growing a metal film containing the metal element on the silicon by reacting an exposed surface of the silicon with the gas; and removing the metal film.

Alternatively, a method of fabricating a semiconductor device of the present invention includes the steps of: forming an oxide film having a non-uniform thickness on silicon; reducing at least a portion of the oxide film using gas containing a metal element, and growing a metal film containing the metal element on the silicon by reacting an exposed surface of the silicon with the gas; forming a capacitive insulating film on the metal film; and depositing a conductive film on the capacitive insulating film to form a capacitor which includes the silicon, the metal film, the capacitive insulating film and the conductive film.

Alternatively, a method of fabricating a semiconductor device of the present invention includes the steps of: depositing a metal film on silicon; intruding part of the metal film into silicon by annealing at a temperature equal to or lower than the melting point of the metal film; and removing the metal film.

Alternatively, a method of fabricating a semiconductor device of the invention includes the steps of: depositing, on silicon, a metal film containing a material at a concentration equal to or more than a maximum concentration allowed by a solid solubility at a certain temperature; precipitating the material on the silicon by annealing at the certain temperature; and removing the metal film.

Alternatively, a method of fabricating a semiconductor device of the present invention includes the steps of: forming an oxide film having a non-uniform thickness on silicon; reducing at least a portion of the oxide film using gas, and growing a dielectric film on the silicon by reacting an exposed surface of the silicon with the gas; and depositing a conductive film on the dielectric film to form a capacitor which includes the silicon, the dielectric film and the conductive film.

Thus, the invention described herein makes possible the advantage of providing a method of fabricating a semiconductor device in which a surface area of a silicon material can be easily increased with good. reproducibility.

This and other advantages of the present invention will become apparent to those skilled in the art upon reading and understanding the following detailed description with reference to the accompanying figures.

BRIEF DESCRIPTION OF THE DRAWINGS

FIGS. 1A to 1C are cross sectional views illustrating process steps in a method of fabricating a semiconductor device according to the present invention.

DESCRIPTION OF THE PREFERRED EMBODIMENTS

Figure 2A:
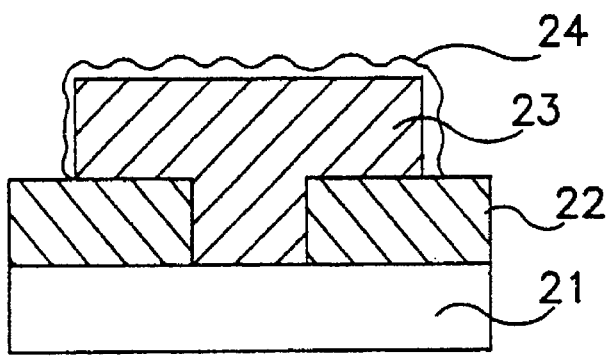
FIGS. 2A to 2C are cross sectional views illustrating process steps in another method of fabricating a semiconductor device according to the present invention.

Referring to FIGS. 1A through 1C, a method of fabricating a semiconductor device of the present invention will now be described.

First, a polycrystalline silicon film 12 is deposited on a substrate 11 by low pressured CVD, and then the substrate 11 is immersed in a mixed solution of an aqueous hydrogen peroxide solution and a sulfuric acid (about 130° C.). The term "polycrystalline silicon" is hereinafter referred to as "polysilicon". As a result of the immersion, as is shown in FIG. 1A, the surface of the polysilicon film 12 is oxidized by the mixed solution and hence a thin silicon oxide film 13 is formed on the polysilicon film 12.

The polysilicon film 12 which is formed by low pressure CVD is composed of a number of columnar crystal grains. Between respective crystal grains, there exist grain boundaries where impurities are likely to be precipitated. As a result, the oxidation rate at the surface of the polysilicon film 12 varies from position to position at the surface. Therefore, the thickness of the resulting thin silicon oxide film 13 is not uniform, and the silicon oxide film 13 may be a porous film. The thickness of the silicon oxide film 13 is preferably in the range of 10 angstroms to 50 angstroms.

Even if the surface of the polysilicon film 12 is not immersed in the mixed solution of the aqueous hydrogen peroxide solution and the sulfuric acid (about 130° C.), a native oxide film is formed at the surface of the polysilicon film 12 by the contact with the atmospheric air. However, by performing a step for oxidizing the surface of the polysilicon film 12 using the mixed solution of the aqueous hydrogen peroxide solution and the sulfuric acid, the silicon oxide film 13 having the non-uniform thickness can be formed with good reproducibility. In the step for forming the silicon oxide film 13, an oxidizing solution or an oxidizing gas may be used other than the mixed solution of the aqueous hydrogen peroxide solution and the sulfuric acid. For example, a wet oxidation method, or a dry oxidation method may be applied. Alternatively, without performing the step for forming the silicon oxide film 13, a native oxide film which is formed by the contact of the polysilicon film 12 with the atmospheric air for an appropriate time period at a room temperature or more may be used as the silicon oxide film 13.

Next, the substrate 11 is positioned in a tungsten hexafluoride (WF$_6$) gas of 10 sccm (standard cubic centimeters per minute) which is diluted by an argon (Ar) gas of 100 sccm. The temperature of the gas is set in the range of 250° C. to 300° C., and the pressure is set at 250 mTorr (millitort). Under the above conditions as is shown in FIG. 1B, a tungsten film 14 grows on the polysilicon film 12. The growth occurs due to a reaction represented by the following chemical equation.

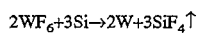

$$2WF_6 + 3Si \rightarrow 2W + 3SiF_4\uparrow$$

The above reaction starts when the polysilicon film 12 comes into contact with the gas through holes which are formed by reducing at least a portion of the silicon oxide film 13 with the gas or the holes which are inherently formed in the porous silicon oxide film 13. As described above, the thickness of the silicon oxide film 13 is not uniform. Therefore, the surface of the polysilicon film 12 locally comes into contact with the gas, when relatively thin portions of the silicon oxide film 13 (portions having a thickness of about 20 angstroms or less) are reduced and removed completely within a certain period of time (relatively short time), or when the gas passes through the relatively thin portions. As a result of the contact, the gas reacts with the surface of the polysilicon film 12, whereby tungsten grows unevenly on the polysilicon film 12. With the progress of the reaction, silicon is volatilized as SiF$_4$ from the surface of the polysilicon film 12. On the other hand, since relatively thick portions of the silicon oxide film 13 are not reduced and removed completely within the certain period of time, the gas cannot pass through the relatively thick portions. Therefore, tungsten does not grow on portions of the polysilicon film 12 which are covered with the relatively thick portions of the silicon oxide film 13. The above fact is reported in M. L. Green et al., J. Electrochem. Soc. 33, 2285 (1987). Due to the local growth (the reaction with silicon) of the tungsten film 14, an interface 15 between the polysilicon film 12 and the tungsten film 14 is made uneven, as is shown in FIG. 1B. Recessed portions are the portions where tungsten grows due to the reaction of the gas with the polysilicon film 12. In order to form such unevenness, instead of the growth of the tungsten film 14, another metal film may be caused to grow due to a reaction similar to the reaction represented by the above chemical equation. For example, if gas such as MoF$_5$, MoCl$_3$, TiCl$_4$, or TaCl$_5$ is used, it is possible to unevenly grow a molybdenum film, a titanium film, or a tantalum film on silicon.

The metal film will be removed after the growth. Therefore, a film made of a material other than metals may be caused to grow instead of the metal film as far as the film can grow due to the reaction with silicon.

According to this example, a difference in level of the unevenness at the interface 15 may approximately be from 50 nm (nanometer) to 150 nm.

Next, the tungsten film 14 is selectively removed by wet etching with a mixed solution of an aqueous hydrogen peroxide solution and a sulfuric acid (130° C.). Thus, the polysilicon film 12 having an increased surface area as a result of the growth step of the tungsten film 14 can be obtained. For selectively removing the tungsten film 14, a solution other than the mixed solution of the aqueous hydrogen peroxide solution and the sulfuric acid can be used.

According to this example, the surface area of the polysilicon film 12 after the removal of the tungsten film 14 is 1.6 times as large as the surface area of the polysilicon film 12 directly after the deposition. According to this example, by controlling the formation conditions of the silicon oxide film 13 and the growth conditions of the tungsten film 14, the surface area of the polysilicon film 12 can be enlarged by about 1.2 to 1.6 times.

According to the method of the present invention, not only the surface area of the polysilicon film 12 but also a surface area of a single crystalline silicon substrate or film, or a surface area of an amorphous silicon film can be increased. The single crystalline silicon substrate and film and the amorphous silicon film have uneven surfaces but the unevenness degree is lower than that of the surface of the polysilicon film 12. However, by an oxidation process using an oxidizing solution, the silicon oxide film 13 having sufficiently non-uniform thickness can be formed, whereby the surface area thereof can be sufficiently increased.

Figure 2B:
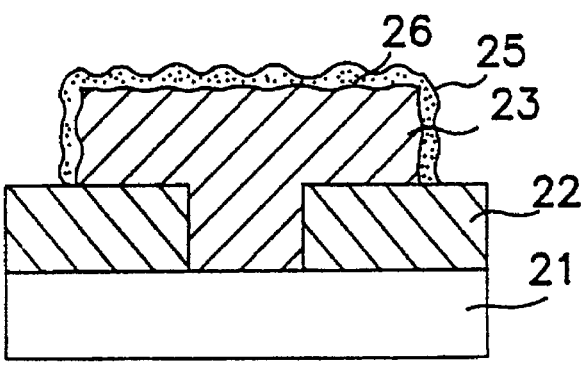
Figure 2C:
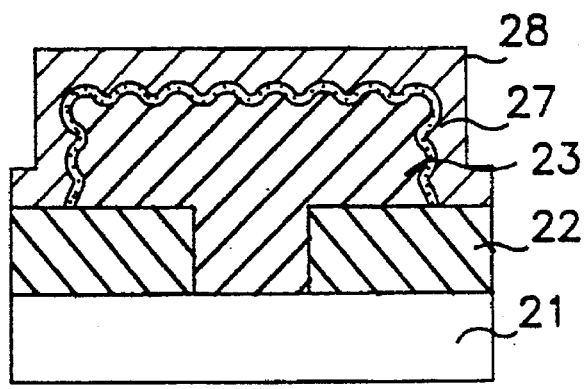

Secondly, an example in which a charge storage electrode for a capacitor in a memory cell of a semiconductor memory device is formed according to the method of the present invention will be described with reference to FIGS. 2A to 2C. For simplification, only a stacked-type capacitor in a certain single memory cell is shown in FIGS. 2A to 2C. Elements other than the capacitor such as a transistor and interconnections are omitted. The formation of the elements other than the capacitor is performed using known techniques.

First, as is shown in FIG. 2A, an insulating film 22 is formed on a silicon substrate 21 by CVD so as to cover a transistor (not shown). Then, an opening is formed at a predetermined region of the insulating film 22 by lithography and etching techniques. The opening is used for connecting a charge storage electrode 23 of the capacitor to the silicon substrate 21. A phosphorus-doped (P-doped) polysilicon film is deposited on the insulating film 22 so as to come into contact with the silicon substrate 21 via the opening. Thereafter, the polysilicon film is patterned by the lithography and etching techniques so as to form the charge storage electrode 23. The charge storage electrode 23 is in contact with the silicon substrate 21 via the opening in the insulating film 22, as is shown in FIG. 2A. More precisely, the charge storage electrode 23 is electrically connected to an impurity diffused region (not shown) which is formed on a surface of the silicon substrate 21. The impurity diffused region is electrically connected to one of source/drain regions of a switching transistor (not shown), or functions as either source or drain.

Next, a silicon oxide film 24 is formed on the surface of the charge storage electrode 23 in the same manner as in the first example. Thereafter, a tungsten film 25 is grown in the same manner as in the first example, so as to make an interface 26 uneven, as is shown in FIG. 2B. Then, the tungsten film 25 is removed. As a result, the charge storage electrode 23 having an increased surface area can be obtained.

Next, using a known method, a capacitive insulating film 27 is deposited on the charge storage electrode 23 and then a plate electrode 28 is formed, whereby a capacitor which is constituted by the charge storage electrode 23, the capacitive insulating film 27, and the plate electrode 28 is formed. As the capacitive insulating film 27, a silicon oxide film which is formed by oxidizing the surface of the charge storage electrode 23 of silicon, or an ONO film including such oxide films and a nitride film may be used.

The charge storage electrode 23 of the thus formed capacitor has an increased surface area as compared with the prior art. As a result, the capacitance of the capacitor also increases in proportion to the increased degree of the surface area. Therefore, when a capacitor in a memory cell of a DRAM is formed in accordance with the method of this example, a memory cell having a desired charge storage electrode and having a reduced size can be provided.

Among the capacitors which are formed in accordance with the method of the present invention, a capacitor having a size of 3 μm² and having a 6 nm thick ONO film as the capacitive insulating film 27 has a capacitance of 26.7 fF (femtofarad). On the other hand, a capacitor having the same size which is formed by a conventional method has a capacitance of 17.3 fF. The above increase in capacitance is considered to be caused by the increase in the surface area of the charge storage electrode 23 by about 1.6 times.

In the method of this example, after the removal of the tungsten film 25, the capacitive insulating film 27 is formed on the charge storage electrode 23 of silicon. Alternatively, without removing the tungsten film 25, the capacitive insulating film 27 may be deposited directly on the tungsten film 25. When the tungsten film is grown by the method of this example, the unevenness degree of the surface of the charge storage electrode 23 of silicon is increased due to the uneven growth. Also, the unevenness degree of the surface of the tungsten film 25 is increased. Therefore, if the capacitive insulating film 27 is formed directly on the tungsten film 25, a capacitance which is equal to or larger than the capacitance of the capacitor formed by the method of the above example can be attained. For example, a $Ta_2O_5$ film which is made of one of high dielectric materials may be formed on the tungsten film 25 as the capacitive insulating film 27. In such a case where the tungsten film 25 is not removed, the presence of the tungsten film 25 prevents the direct contact of the capacitive insulating film 27 with the charge storage electrode 23 of silicon, whereby the dielectric material which may react with silicon can be used as the material of the capacitive insulating film 27.

Now, an example in which the present invention is applied to the formation of a contact.

Generally, a contact resistance varies in inverse proportion to an area of the contact interface. Accordingly, if the unevenness degree of the contact interface can be increased and hence the contact area can be substantially increased, the contact resistance can be reduced while an opening area of a contact hole is maintained constant. Hereinafter, the method will be described with reference to FIGS. 3A to 3C.

Figure 3A:
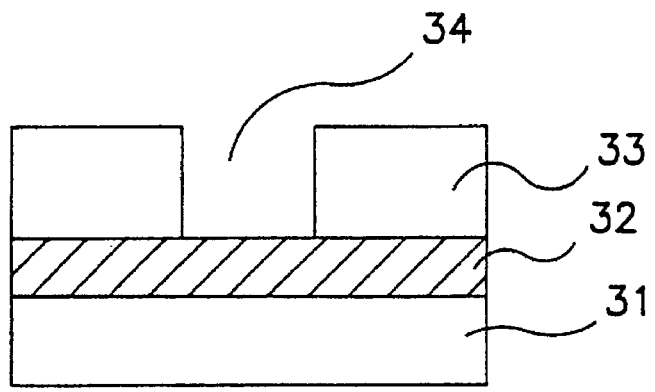
FIGS. 3A to 3C are cross sectional views illustrating process steps in still another method of fabricating a semiconductor device according to the present invention.
Figure 3B:
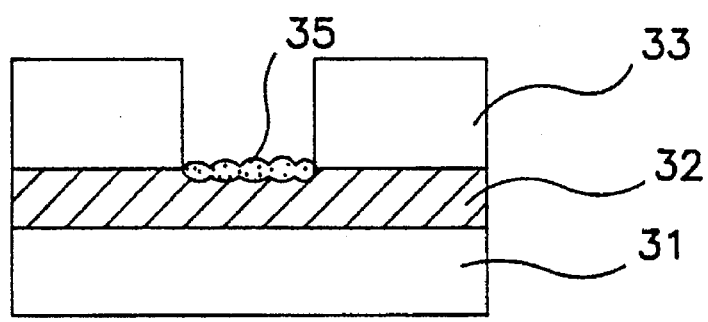

First, as is shown in FIG. 3A, a P-doped polysilicon interconnection 32 is formed on a substrate 31. Between the substrate 31 and the polysilicon interconnection 32, an insulating film (not shown) is provided. Then, after an interlevel insulating film 33 is formed so as to cover the polysilicon interconnection 32, a contact hole 34 is formed in the interlevel insulating film 33. Thereafter, a tungsten film 35 is caused to grow on a portion of the surface of the polysilicon interconnection 32 which is exposed at the bottom of the contact hole 34. As is shown in FIG. 3B, the tungsten film 35 is not grown on the interlevel insulating film 33, but is selectively grown only on the polysilicon interconnection 32.

Figure 3C:
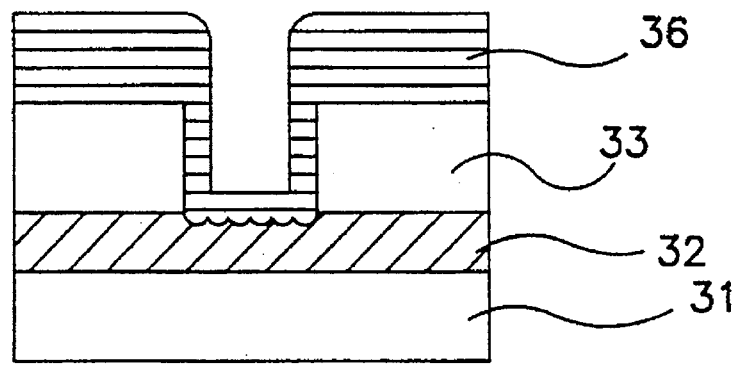

Next, after the tungsten film 35 is removed, as is shown in FIG. 3C, an Al (aluminum) interconnection 36 is formed on the interlevel insulating film 33, whereby an electric contact of the Al interconnection 36 with the polysilicon interconnection 32 is realized.

Thus, since the unevenness degree of the polysilicon interconnection 32 is increased, the surface area of the polysilicon interconnection 32 is increased by 1.6 times as compared with the prior art described above. As a result, the contact resistance is reduced down to $1/1.6$.

If, after the unevenness degree of the contact region of the polysilicon interconnection 32 is increased, impurity ions are implanted through the contact hole 34, the contact resistance can be further reduced.

As described above, according to this example, the contact resistance can be reduced without decreasing the opening area of the contact hole 34.

Figure 4A:
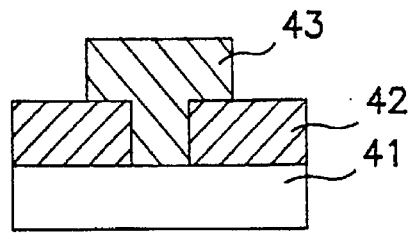
FIGS. 4A to 4E are cross sectional views illustrating process steps in still another method of fabricating a semiconductor device according to the present invention.
Figure 4B:
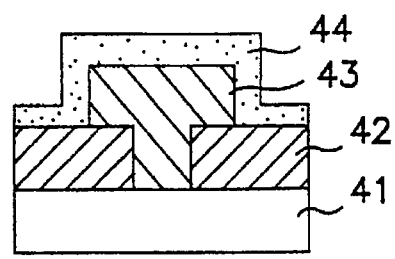

Referring to FIGS. 4A to 4E, another example of the present invention will be described. First, as is shown in FIG. 4A, an insulating film 42 is formed on a silicon substrate 41 so as to cover a transistor (not shown), and then an opening is formed in a predetermined portion of the insulating film 42 by the lithography and etching techniques. The opening is used for connecting a charge storage electrode 43 of a capacitor to the silicon substrate 41. After a P-doped polysilicon film is deposited on the insulating film 42 so as to come into contact with the silicon substrate 41 via the opening, the polysilicon film is patterned by the lithography and etching techniques, so as to form the charge storage electrode 43. The charge storage electrode 43 is in contact with the silicon substrate 41 via the opening in the insulating film 42, as is shown in FIG. 4B. More precisely, the storage electrode 43 is electrically connected to an impurity diffused region (not shown) which is formed at the surface of the silicon substrate 41. The impurity diffused region is electrically connected to one of source/drain regions of a switching transistor, or functions as either source or drain.

Figure 4C:
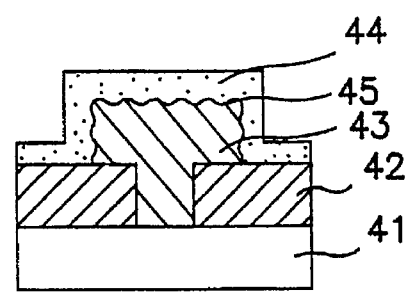
Figure 4D:
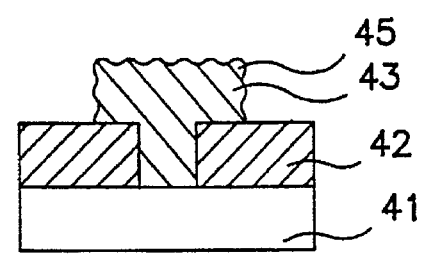
Figure 4E:
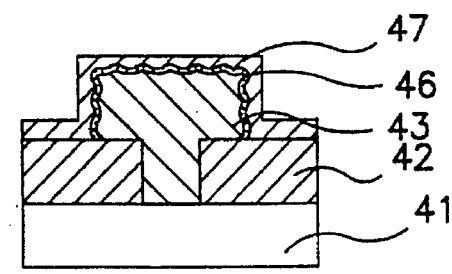

Next, as is shown in FIG. 4C, a pure Al film 44 is formed on the insulating film 42 by sputtering so as to cover the charge storage electrode 43.

An annealing step is performed at a temperature which is equal to or lower than a melting point of the pure Al film 44, for example, at 450° C. As a result, the surface of the charge storage electrode 43 is non-uniformly reacted with the pure Al film 44, whereby the unevenness degree at the interface between the charge storage electrode 43 and the pure Al film 44 is increased.

A solid solubility of silicon in aluminum (hereinafter, referred to simply as "a solid solubility") varies depending on the temperature. In the annealing step, silicon is dissolved (diffused) into aluminum until the solid solubility at the annealing temperature is satisfied in the vicinity of the interface between aluminum and silicon. Aluminum is dissolved (diffused) into silicon. Thus, materials are mutually moved between aluminum and silicon. As a result the thermodynamic material movement occurs non-uniformly at the interface and the unevenness degree at the interface is increased. If aluminum contains sufficient silicon, for example, if aluminum previously contains silicon at the maximum concentration allowed by the solid solubility at the annealing temperature, the above material movement is difficult to occur. Therefore, it is necessary for the Al film to contain silicon at a concentration lower than the maximum concentration allowed by the solid solubility at the annealing temperature. As far as the silicon concentration in the Al film is lower than the maximum concentration allowed by the solid solubility at the annealing temperature, a material other than aluminum, for example an aluminum alloy containing copper, scandium, etc. can be used.

After the annealing step, the pure Al film 44 is selectively removed using a mixed solution of a phosphoric acid and an acetic acid. As far as aluminum can be selectively etched with respect to silicon, another solution or gas may used as the etchant. Thereafter, a capacitive insulating film 46 is deposited on the charge storage electrode 43 in a conventional manner. Then, a plate electrode 47 is formed, so as to form a capacitor which is constituted by the charge storage electrode 43, the capacitive insulating film 46 and the plate electrode 47.

The charge storage electrode 43 of the thus formed capacitor has an increased surface area as compared with the prior art. Accordingly, the capacitance of the capacitor is also increased in proportion to the increase in surface area. Therefore, when a capacitor of a memory cell in a DRAM is formed in accordance with the method of this example, a memory cell having a desired charge storage electrode and having a reduced size can be provided.

In the above example, the pure Al film 44 is formed after the polysilicon film is patterned to form the charge storage electrode 43. Alternatively, the pure Al film 44 may be formed on the polysilicon film before the polysilicon film is patterned. In this case, after the annealing step and the removal step of the Al film, the polysilicon film having the uneven top face is patterned, so as to form the charge storage electrode 43.

According to this example, it is unnecessary to use a CVD apparatus for growing a metal film, for example, the tungsten film, on silicon. An Al sputter apparatus which is introduced in the production line as a semiconductor fabricating apparatus can be used.

Now, another method in which the unevenness degree of the surface of silicon is increased by precipitation of materials contained in aluminum on silicon, instead of by the diffusion between aluminum and silicon, will be described.

Figure 5A:
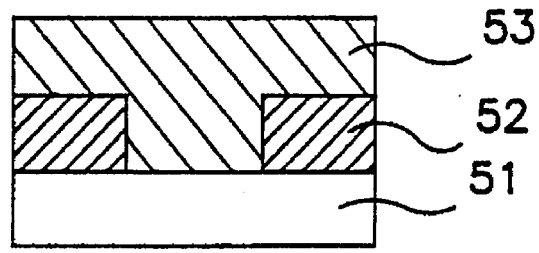
FIGS. 5A to 5E are cross sectional views illustrating process steps in still another method of fabricating a semiconductor device according to the present invention.

First, as is shown in FIG. 5A, an insulating film 52 is formed on a silicon substrate 51 so as to cover a transistor (not shown). Then, an opening is formed in a predetermined portion of the insulating film 52 by the lithography and etching techniques. The opening is used for connecting a charge storage electrode 53 of a capacitor which will be formed later to the silicon substrate 51. After a P-doped polysilicon film is deposited on the insulating film 52 so as to come into contact with the silicon substrate 51 via the opening, the polysilicon film is patterned by the lithography and etching techniques, so as to form the charge storage electrode 53. The charge storage electrode 53 is in contact with the silicon substrate 51 via the opening in the insulating film 52. More precisely, the charge storage electrode 53 is electrically connected to an impurity diffused region (not shown) which is formed at the surface of the silicon substrate 51. The impurity diffused region is electrically connected to one of source/drain regions of a switching transistor, or functions as either source or drain.

Figure 5B:
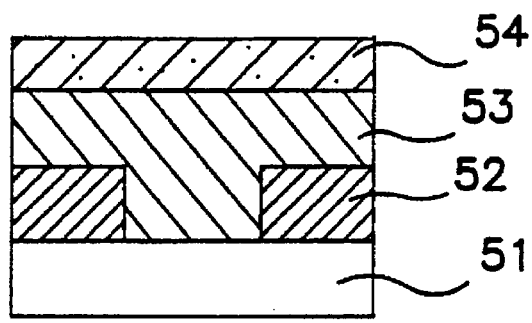
Figure 5C:
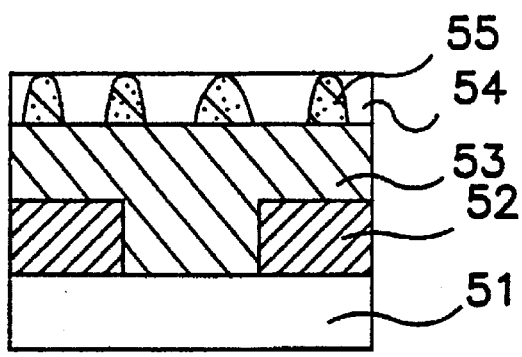

Next, as is shown in FIG. 5C, an Al film 54 containing silicon of 10 percentage by weight is formed above the insulating film 52 by sputtering so as to cover the charge storage electrode 53. The Al film 54 contains silicon at a concentration which exceeds the maximum concentration allowed by the solid solubility at 450° C.

Figure 8A:
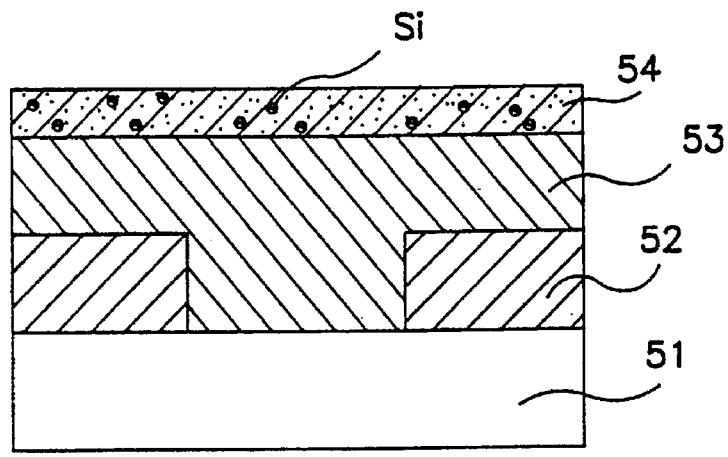
FIGS. 8A to 8C are cross sectional views of process steps illustrating a silicon precipitation phenomenon which occurs as a result of an annealing step in a method of fabricating a semiconductor device according to the present invention.
Figure 8B:
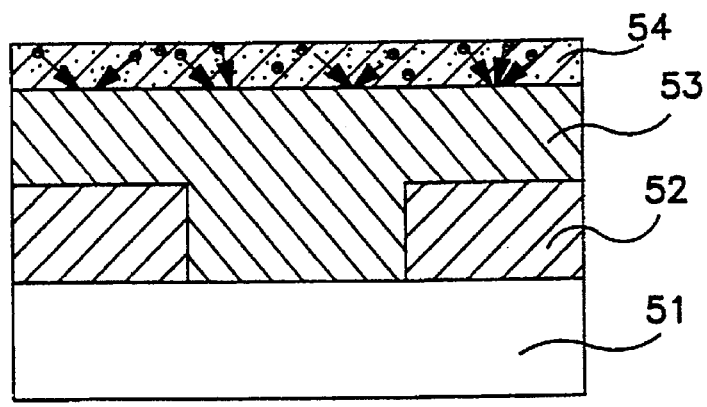
Figure 8C:
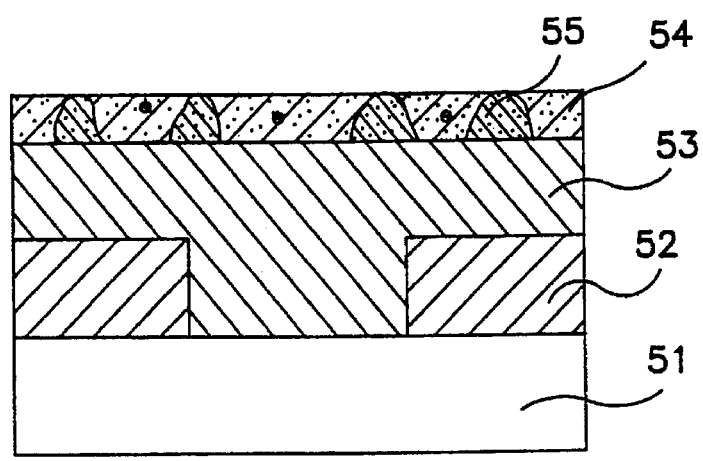

Next, an annealing step is performed at a temperature which is equal to or lower than a melting point of the Al film 54, for example, at 450° C. As a result of the annealing step, silicon is precipitated on the surface of the charge storage electrode 53 from the Al film 54. Hereinafter, the silicon precipitation phenomenon is described in more detail with reference to FIGS. 8A to 8C. FIG. 8A is a cross sectional view showing a semiconductor device before the annealing step. This figure corresponds to FIG. 5B, and silicon which is contained in the Al film 54 is schematically shown in FIG. 8A. In the annealing step, as is shown in FIG. 8B, part of the silicon which is contained in the Al film 54 epitaxially grows on a portion where precipitation cores are formed on the surface of the charge storage electrode 53. Thus, the precipitation of silicon, i.e., the growth of silicon precipitates 55 non-uniformly occurs on the charge storage electrode 53. After the annealing step, as is shown in FIG. 8C, a number of silicon precipitates 55 are formed, whereby the charge storage electrode 53 having an increased surface area can be obtained. The height of each of the silicon precipitates 55 corresponds to the thickness of the deposited Al film 54.

Figure 5D:
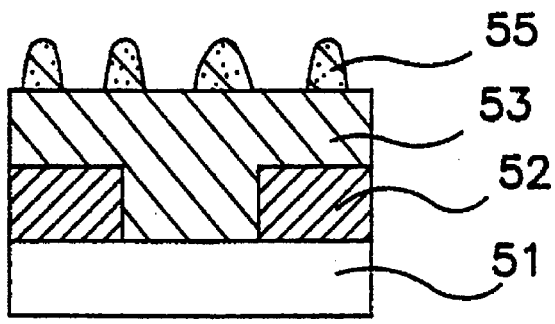
Figure 5E:
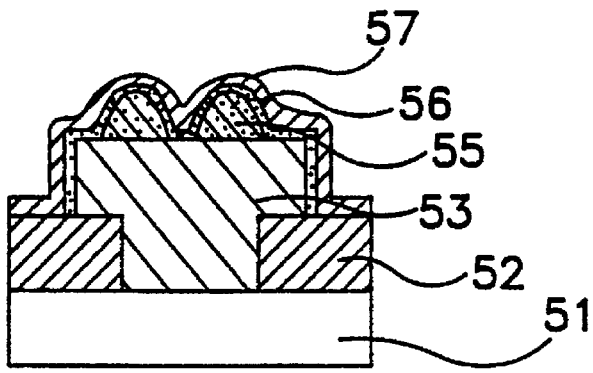

Next, the Al film 54 is selectively removed using a mixed solution of a phosphoric acid and an acetic acid at about 60° C. so as to leave the silicon precipitates 55. As far as Al can be selectively etched with respect to silicon, another solution or gas can be used as the etchant. Thus, as is shown in FIG. 5D, the charge storage electrode 53 which has an increased surface area due to the plurality of silicon precipitates 55 (hereinafter, the silicon precipitate 55 and the charge storage electrode 53 are sometimes referred to collectively as "the charge storage electrode 53").

The formation of the silicon precipitates 55 occurs when the Al film 54 contains, at least silicon at a concentration which exceeds the maximum concentration allowed by the solid solubility at the annealing temperature. The precipitation can occur even if a material other than silicon is used. For example, when the Al film 54 contains germanium at a concentration which exceeds the maximum concentration allowed by the solid solubility at the annealing temperature, germanium precipitates are formed on the charge storage electrode 53, whereby the surface area of the charge storage electrode 53 is increased. Alternatively, the Al film 54 may be an alloy film which contains a material such as copper or scandium which is not precipitated. In order to give conductivity to the silicon precipitates 55, impurities are doped into the silicon precipitates 55. It is preferred that the impurities are the same as those which have been doped in the charge storage electrode 53. Preferably, the doping is performed by ion implantation, before the Al film 54 is removed by etching or after the Al film 54 is removed.

Then, after a capacitive insulating film 56 is deposited on the charge storage electrode 53 by a conventional method, a plate electrode 57 is formed. Thus, a capacitor which is constituted by the charge storage electrode 53, the capacitive insulating film 56, and the plate electrode 57 is formed.

Hereinafter, a method for forming a contact will be described with reference to FIGS. 6A to 6D.

Figure 6A:
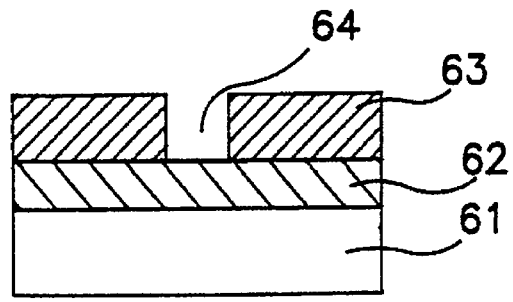
FIGS. 6A to 6D are cross sectional views illustrating process steps in still another method of fabricating a semiconductor device according to the present invention.
Figure 6B:
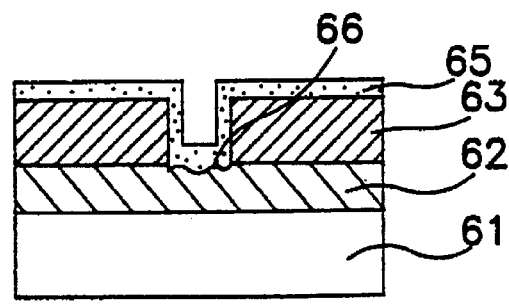

First, as is shown in FIG. 6A, a P-doped polysilicon interconnection 62 is formed on a substrate 61. Between the substrate 61 and the polysilicon interconnection 62, an insulating film (not shown) is provided. Then, after an interlevel insulating film 63 is formed so as to cover the polysilicon interconnection 62, a contact hole 64 is formed in the interlevel insulating film 63. Thereafter, an Al film 65 is deposited on the interlevel insulating film 63 so as to come into contact with a portion of the surface of the polysilicon interconnection 62 which is exposed at the bottom of the contact hole 64 (FIG. 6B).

Figure 6C:
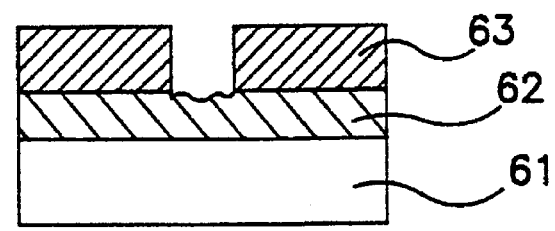
Figure 6D:
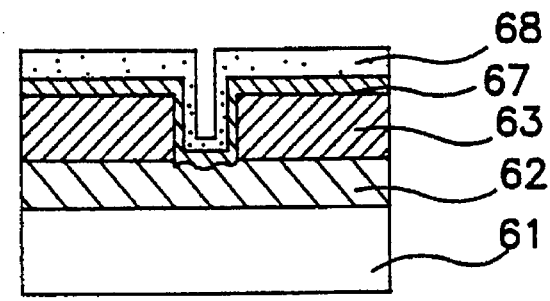
Figure 7:
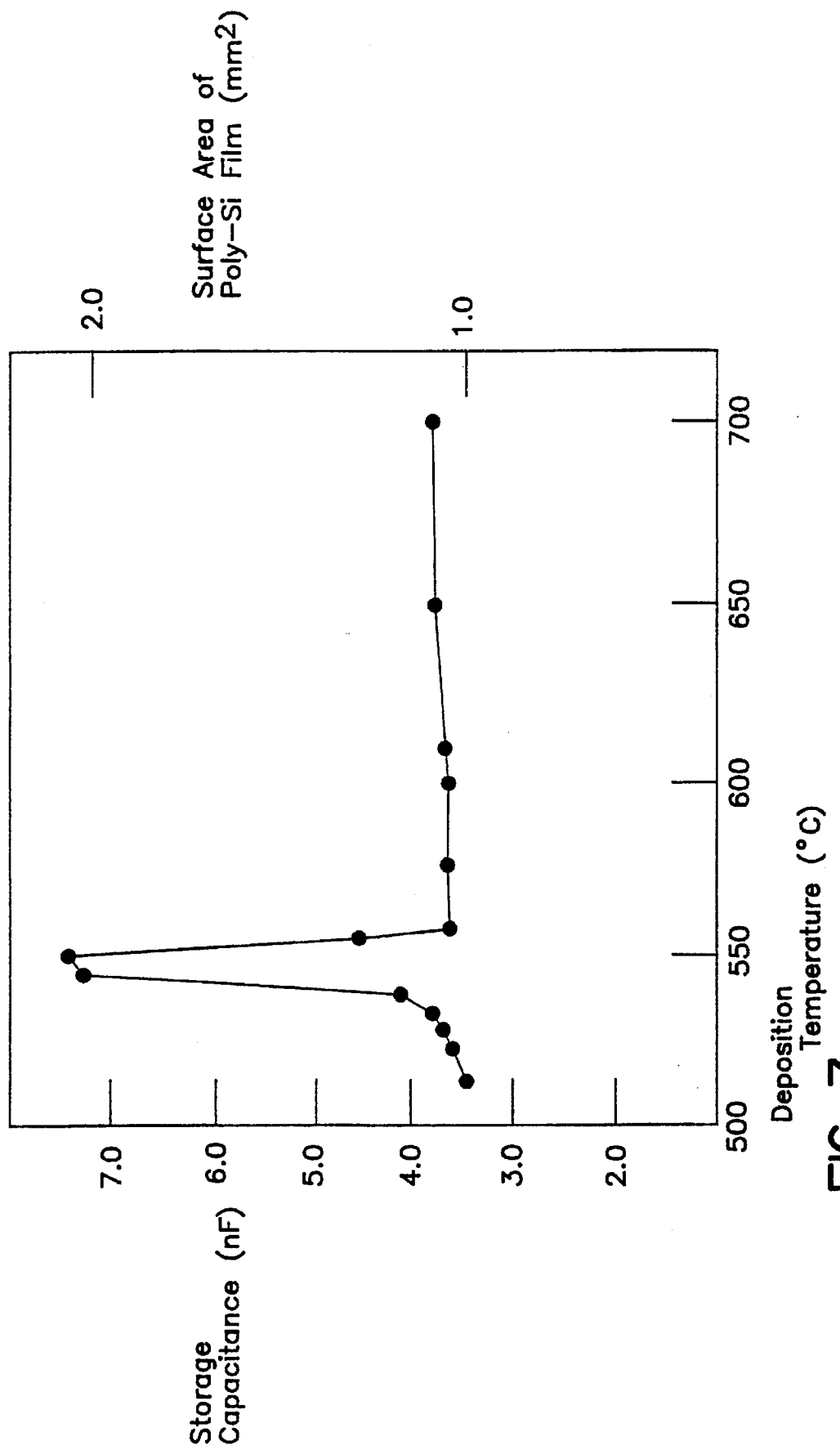
FIG. 7 is a graph showing a relationship between a deposition temperature for depositing a silicon film and a surface area of the resulting silicon film.

Then, as is shown in FIG. 6C, the Al film 65 is removed so that the contact face having an increased surface area is exposed. Thereafter, as is shown in FIG. 6D, a barrier metal film 67 and an Al alloy film 68 are formed on the interlevel insulating film 63, whereby interconnections constituted by the films 67 and 68 are formed.

If impurity ions are implanted through the contact hole 64 after the unevenness degree of the contact portion of the polysilicon interconnection 62 is increased, the contact resistance can be further reduced.

According to the present invention, the surface of a silicon film can be readily be made greatly uneven without adjusting the deposition temperature of the silicon film within a narrow range. Furthermore, the degree of the surface unevenness does not depend on the impurity concentration in silicon. Thus, by the method according to the present invention, the surface area of the charge storage electrode can be increased and the capacitance of the capacitor can be increased with good reproducibility. Moreover, an area of the contact interface is substantially increased without increasing the opening area of the contact hole, whereby the contact resistance can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of fabricating a semiconductor device, comprising the steps of:

depositing an aluminum film on a surface of silicon;

intruding part of said aluminum film into said surface of said silicon by annealing at a temperature equal to or lower than the melting point of said aluminum film to thereby control the amount of aluminum that intrudes into said surface so that the aluminum film intrudes with positional non-uniformity of thickness;

removing said aluminum film;

forming a capacitive insulating film on said surface of said silicon after said step of removing said aluminum film; and depositing a conductive film on said capacitive insulating film to form a capacitor which includes said surface of said silicon, said capacitive insulating film and said conductive film.

2. A method according to claim 1, said method further comprising the steps of:

forming an insulating film which covers said surface of said silicon before said step of depositing said aluminum film;

forming a contact hole in said insulating film for exposing a portion of a surface of said silicon; and forming, after said step of removing said aluminum film, a conductive material on said portion of the surface of said silicon which is exposed through said contact hole, and connecting said surface of said silicon to said conductive material.

3. A method according to claim 1, wherein said aluminum film is an aluminum alloy film that contains silicon at a concentration lower than the maximum concentration allowed by a solid solubility at a certain temperature, said certain temperature being equal to or lower than the melting point of said aluminum alloy.

4. A method of fabricating a semiconductor device, the method comprising the steps of:

forming an insulating film which covers a surface of said silicon;

forming a contact hole in said insulating film for exposing a portion of said surface of said silicon;

depositing an aluminum film on said portion of said surface of silicon which is exposed;

intruding part of said aluminum film into said portion of said surface of said silicon which is exposed by annealing at a temperature equal to or lower than the melting point of said aluminum film to thereby control the mount of aluminum that intrudes into said surface so that the aluminum film intrudes with positional non-uniformity of thickness;

removing said aluminum film;

forming, after said step of removing said aluminum film, a conductive material on said portion of the surface of said silicon which is exposed through said contact hole, and connecting said surface of said silicon to said conductive material.

5. A method according to claim 4, wherein said aluminum film is an aluminum alloy film that contains silicon at a concentration lower than the maximum concentration allowed by a solid solubility at a certain temperature, said certain temperature being equal to or lower than the melting point of said aluminum alloy.

* * * * *

UNITED STATES PATENT AND TRADEMARK OFFICE
CERTIFICATE OF CORRECTION

PATENT NO. : 5,661,068
DATED : August 26, 1997
INVENTOR(S) : Hirao, et. al.

It is certified that error appears in the above-identified patent and that said Letters Patent is hereby corrected as shown below:

Title page, item [56] under "References Cited, OTHER PUBLICATIONS" line 3, delete "(1990)' and replace with--(1990--.

Column 2, line 31, delete the "." between the words "good and "reproducibility".

Column 3, line 44, delete "millitort" and replace with --millitorr--.

Column 10, line 45, delete "mount" and replace with --amount--.

Signed and Sealed this

Sixteenth Day of December, 1997

Attest:

BRUCE LEHMAN

*Attesting Officer*  *Commissioner of Patents and Trademarks*